(12) United States Patent
Wang et al.

(10) Patent No.: US 11,380,539 B2
(45) Date of Patent: Jul. 5, 2022

(54) SELECTIVE DEPOSITION OF SILICON NITRIDE

(71) Applicant: ENTEGRIS, INC., Billerica, MA (US)

(72) Inventors: Han Wang, Cromwell, CT (US); Bryan C. Hendrix, Danbury, CT (US); Eric Condo, Shelton, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 157 days.

(21) Appl. No.: 16/789,106

(22) Filed: Feb. 12, 2020

(65) Prior Publication Data

US 2020/0266048 A1 Aug. 20, 2020

Related U.S. Application Data

(60) Provisional application No. 62/805,644, filed on Feb. 14, 2019, provisional application No. 62/808,020, filed on Feb. 20, 2019.

(51) Int. Cl.
*H01L 21/31* (2006.01)
*H01L 21/02* (2006.01)
*C23C 16/34* (2006.01)
*C23C 16/04* (2006.01)
*C23C 16/455* (2006.01)

(52) U.S. Cl.
CPC .......... *H01L 21/0217* (2013.01); *C23C 16/04* (2013.01); *C23C 16/345* (2013.01); *C23C 16/45525* (2013.01); *H01L 21/0228* (2013.01); *H01L 21/02205* (2013.01); *H01L 21/02208* (2013.01)

(58) Field of Classification Search
CPC ......... H01L 21/02205; H01L 21/02208; H01L 21/0217; H01L 21/0228; C23C 16/04; C23C 16/345; C23C 16/45525
USPC .......................................................... 438/791
See application file for complete search history.

(56) References Cited

U.S. PATENT DOCUMENTS

| | | | |
|---|---|---|---|
| 9,355,837 B2 | 5/2016 | Marsh | |
| 2005/0145177 A1* | 7/2005 | McSwiney | C23C 16/345 118/723 MA |
| 2007/0131970 A1 | 6/2007 | Mittereder | |
| 2012/0213940 A1 | 8/2012 | Mallick | |
| 2016/0322213 A1 | 11/2016 | Thompson | |
| 2017/0154806 A1 | 6/2017 | Wang | |
| 2018/0323055 A1 | 11/2018 | Woodruff | |
| 2019/0330736 A1* | 10/2019 | Wang | C23C 16/45553 |

FOREIGN PATENT DOCUMENTS

KR 20110098579 A 9/2011

* cited by examiner

*Primary Examiner* — Brook Kebede
(74) *Attorney, Agent, or Firm* — Entegris, Inc.

(57) ABSTRACT

Certain embodiments of the invention utilize low temperature atomic layer deposition methodology to form material containing silicon and nitrogen (e.g., silicon nitride). The atomic layer deposition uses silicon tetraiodide ($SiI_4$) or disilicon hexaiodide ($Si_2I_6$) as one precursor and uses a nitrogen-containing material such as ammonia as another precursor. In circumstances where a selective deposition of silicon nitride is desired to be deposited over silicon dioxide, the substrate surface is first treated with ammonia plasma.

19 Claims, 2 Drawing Sheets

SELECTIVE DEPOSITION OF SILICON NITRIDE

FIELD OF THE INVENTION

This invention relates to methodology for selective deposition of silicon nitride onto a microelectronic device.

BACKGROUND OF THE INVENTION

Silicon nitride is commonly used in the fabrication of integrated circuits. For example, it is often used as an insulating material in the manufacturing of various microelectronic devices such as memory cells, logic devices, memory arrays, etc. Traditionally, silicon nitride films are deposited over the entire substrate surface, while the deposition may be needed only in certain areas. As a result, additional lithography and etch steps are utilized to remove any unwanted regions. It is highly desirable to reduce the number of lithography and etch steps involved, as a means for reducing the overall cost of fabrication. In addition, if the silicon nitride is selectively deposited only where it is needed, then errors in lithography do not affect the definition of the coated area.

SUMMARY OF THE INVENTION

The use of selective deposition of silicon nitride can eliminate conventional patterning steps by allowing silicon nitride to be deposited only in selected and desired areas. Using a silicon iodide precursor alternatively with a thermal nitrogen source alternatively in an ALD or pulsed CVD mode, we can deposit silicon nitride preferentially on an existing nitride surface (e.g., silicon nitride or aluminum nitride) and metal oxide surface (e.g., aluminum oxide or zirconium oxide) with very limited deposition on exposed silicon dioxide surface(s). In addition, we have found that by pre-treating different oxide surfaces with ammonia plasma, a few nanometers of silicon nitride via silicon tetraiodide and a nitrogen compound such as ammonia can be selectively deposited on a silicon dioxide surface, while no or limited deposition is achieved on some "neighboring" metal oxide surfaces (e.g., $Al_2O_3$ and $ZrO_2$). Therefore, this pre-treatment step is the basis for "selective" nitride growth.

DETAILED DESCRIPTION OF THE INVENTION

Figure 1:
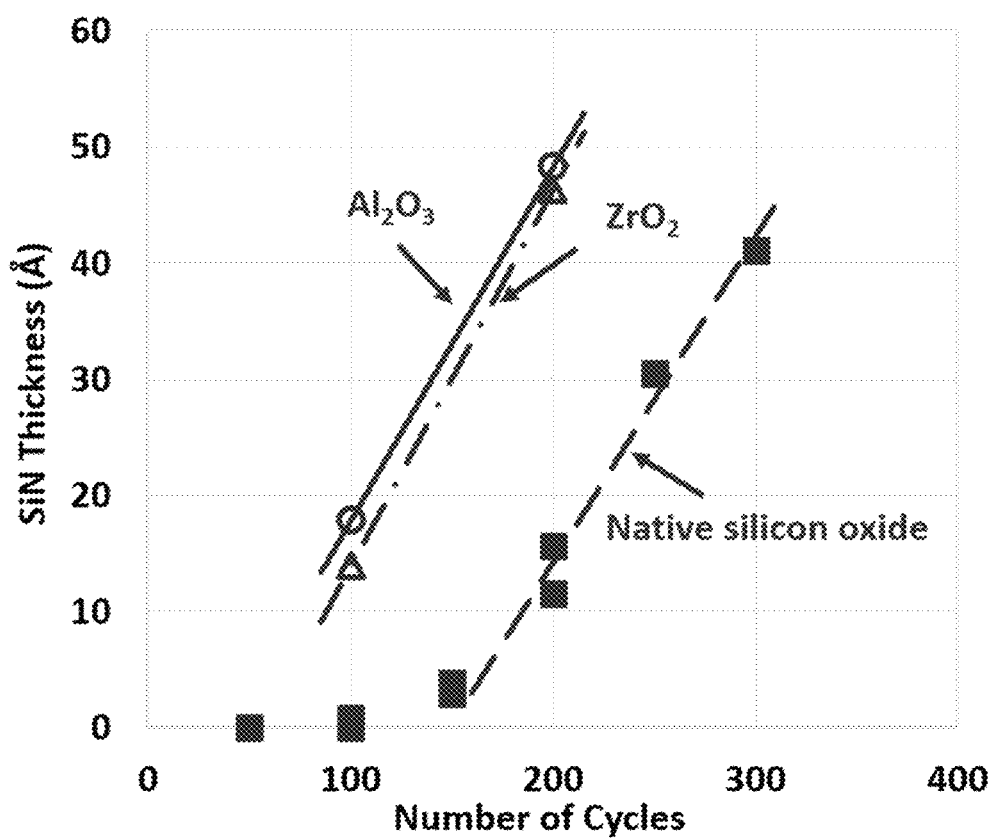
FIG. 1 is an illustration of silicon nitride ($SiI_4/NH_3$) deposition at 200° C. on various oxide substrates as depicted. Thickness in angstroms is plotted versus number of cycles.

The present invention provides a process for the selective atomic layer deposition (ALD) of silicon nitride layers onto various microelectronic device substrates. For the purposes of this invention, we will define ALD as a chemical vapor deposition mode where various reactants and co-reactants are separated in space or time, such that a substrate is exposed alternatively to one reactant separately from the co-reactant. In a first embodiment, the invention provides a process for selectively depositing silicon nitride on a microelectronic device substrate having a plurality of surfaces of differing composition, which comprises contacting said substrate with sequentially pulsed silicon tetraiodide or disilicon hexaiodide, and nitrogen-containing co-reactants, at a temperature of about 150° C. to about 400° C., and at a pressure below about 15 Torr, under atomic layer deposition conditions. In other embodiments, the temperature is from about 175° C. to about 350° C., or about 200° C. to about 250° C. Selective deposition is achieved when the silicon nitride film deposits on some of the exposed surfaces at some manufacturable rate and other surfaces receive an amount of silicon nitride that is negligible or easily removed.

In certain embodiments, one of the microelectronic device surfaces will comprise a nitride surface, such as titanium nitride, aluminum nitride, or silicon nitride. In other embodiments, one of the microelectronic device surfaces will comprise a dielectric surface, such as silicon dioxide, silicon oxynitride, germanium dioxide, SiCO, or a low-k surface. In some embodiments, the dielectric comprises silicon dioxide. In some embodiments, the dielectric is a porous material. In some embodiments, the porous dielectric contains pores which are connected to each other, while in other embodiments the pores are not connected to each other. In some embodiments, the dielectric comprises a low-k material, defined as an insulator with a dielectric value below about 4.0. In some embodiments, the dielectric value of the low-k material is below about 3.5, below about 3.0, below about 2.5 or below about 2.3. In some embodiments, the second surface comprises Si—O bonds. In some embodiments, the second surface is deactivated, for example by a plasma treatment. In some embodiments, the second surface is a non-conducting surface. In certain embodiments, the substrate includes first surfaces, some of which are dielectric and some of which are metallic phases. In some embodiments, one of the surfaces is a dielectric with k higher than silicon dioxide such as aluminum oxide, hafnium oxide, zirconium oxide, titanium oxide, lanthanide oxides, or mixtures of any or all of these oxides.

In certain embodiments, the device substrate is comprised of at least one silicon dioxide surface and at least one aluminum oxide surface, whereby said silicon nitride is selectively deposited on said aluminum oxide surface.

In certain embodiments, the device substrate is comprised of at least one silicon dioxide surface and at least one zirconium dioxide surface, whereby said silicon nitride is selectively deposited on said at least one zirconium dioxide surface.

In certain embodiments, the device substrate is comprised of at least one silicon dioxide surface and at least one aluminum oxide surface, the device surfaces are pre-treated with ammonia plasma, and whereby said silicon nitride is selectively deposited on said at least one silicon dioxide surface.

In certain embodiments, the device substrate is comprised of at least one silicon dioxide surface and at least one hafnium oxide surface, the device surfaces are pre-treated with ammonia plasma, and whereby said silicon nitride is selectively deposited on said at least one silicon dioxide surface.

In certain embodiments, the device substrate is comprised of at least one silicon dioxide surface and at least one zirconium dioxide surface, the device surfaces are pre-treated with ammonia plasma, and whereby said silicon nitride is selectively deposited on said at least one silicon dioxide surface.

In such embodiments, the term "selectively depositing" or "selectivity" is intended to reflect a preferential deposition of silicon nitride on one surface over another. A numerical definition has been given by Gladfelter [Chem. Mater. 5, 1372 (1993)] as the difference in coverage between two surfaces normalized to the sum of the coverage of the same two surfaces. In practice, the selectivity of processes is generally dependent upon the thickness of the film. This invention enables selectivity of greater than 90 % at 18Å. In other embodiments, preferential deposition of silicon nitride on one surface over another surface occurs at an incidence of greater than 95% at over 100 Å.

This ALD methodology utilizes uses silicon tetraiodide ($SiI_4$) or disilicon hexaiodide ($Si_2I_6$) as one "silicon" precursor, and uses a nitrogen-containing material as a co-reactant or as another precursor. The nitrogen-containing material may be organic (for instance, t-butyl hydrazine), or inorganic (for instance, $NH_3$). In some embodiments, a mixture of nitrogen-containing materials may be utilized as precursor for the ALD, and in other embodiments only one nitrogen-containing material may be utilized as precursor for the ALD (for instance, only $NH_3$, or only t-butyl hydrazine). As used herein, the term "a nitrogen-containing material" may be utilized to refer to a precursor material which is pure (for instance, which is entirely $NH_3$ or entirely t-butyl hydrazine), or may refer to a precursor which contains "a nitrogen-containing material" as part of a mixture of nitrogen-containing materials. In certain embodiments, ALD may be used to form material comprising silicon and nitrogen. Such material may comprise, consist essentially of, or consist of silicon nitride, and/or may have other compositions.

We have found that by pre-treating different oxide surfaces by ammonia plasma, a few nanometers of silicon nitride via silicon tetraiodide and a nitrogen compound such as ammonia can be selectively deposited on a silicon dioxide surface, while no or limited deposition is achieved on some metal oxide surfaces (e.g., $Al_2O_3$ and $ZrO_2$). In cases where it is desired that the silicon nitride deposition occurs preferentially on an existing silicon nitride, aluminum nitride, or metal oxide surface (and not on silicon dioxide surfaces), the pre-treatment step with ammonia plasma is omitted.

In atomic layer deposition, sequential processing steps are generally referred to as "pulses" or cycles. As such, ALD processes are based on controlled, self-limiting surface reactions of precursor chemicals. This invention can be practiced with either fully saturated reactions, or, if more manufacturable, merely separate pulses of the precursor and co-reactant. Gas phase reactions are substantially avoided by alternately and sequentially contacting the substrate with the precursors. This can be practiced by moving the substrate from regions of different reactants and co-reactants or by alternating the gas flows over a stationary substrate. In both cases, vapor phase reactants are separated from each other in time and on the substrate surface, for example, by removing excess reactants and/or reactant by-products from the reaction chamber between reactant pulses. In some embodiments, one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate comprising at least a first surface and second, different surface is heated to a suitable deposition temperature ranging from 150° C. to 400° C., generally at lowered pressure of from about 0.5 to 15 torr. In other embodiments, the temperature is from about 175° C. to 350° C. or 200° C. to 250° C. Deposition temperatures are generally maintained below the thermal decomposition temperature of the reactants but at a high enough temperature to avoid condensation of reactants and to provide the activation energy for the desired "selective" surface reactions. Exemplary surfaces include nitrides such as silicon, titanium, and aluminum nitrides, oxides such as silicon dioxide, aluminum oxide, hafnium oxide, and zirconium oxide.

The surface of the substrate is contacted with a vapor phase first reactant. In certain embodiments, a pulse of vapor phase first reactant is provided to a reaction space containing the substrate. In other embodiments, the substrate is moved to a reaction space containing vapor phase first reactant. Conditions are generally selected such that no more than about one monolayer of the first reactant is adsorbed on the substrate surface in a self-limiting manner. The appropriate contacting times can be readily determined by the skilled artisan based on the particular conditions, substrates and reactor configurations. Excess first reactant and reaction by-products, if any, are removed from the substrate surface, such as by purging with an inert gas or by removing the substrate from the presence of the first reactant.

Purging means that vapor phase precursors and/or vapor phase by-products are removed from the substrate surface such as by evacuating a chamber with a vacuum pump and/or by replacing the gas inside a reactor with an inert gas such as argon or nitrogen. In certain embodiments, purging times are from about 0.05 to 20 seconds, between about 1 and 10, or between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In certain embodiments, a pulse of a second gaseous reactant is provided to a reaction space containing the substrate. In other embodiments, the substrate is moved to a reaction space containing the vapor phase second reactant. Excess second reactant and gaseous by-products of the surface reaction, if any, are removed from the substrate surface. The steps of contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

Each phase of each cycle is generally self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In certain embodiments, purging can comprise turning off the flow of the reactive gas while continuing to flow an inert carrier gas to the reaction space. In another embodiment, the purge step may employ a vacuum step to remove excess reactant from the surface.

Reactors capable of being used to grow thin films can be used for the deposition described herein. Such reactors include ALD reactors, as well as CVD reactors equipped with appropriate equipment and means for providing the precursors in a "pulsed" manner. According to certain embodiments, a showerhead reactor may be used.

Examples of suitable reactors that may be used include commercially available equipment, as well as home-built reactors, and will be known to those skilled in the art of CVD and/or ALD.

This invention can be further illustrated by the following examples of certain embodiments thereof, although it will be understood that these examples are included merely for purposes of illustration and are not intended to limit the scope of the invention unless otherwise specifically indicated.

EXPERIMENTAL SECTION

Example 1

In this example, SiN was selectively deposited on a first and a second surface of a substrate relative to a third, different surface of the substrate. In this example, the first surface of the substrate of the substrate comprised $Al_2O_3$ deposited by ALD and the second surface of the substrate comprised ALD deposited $ZrO_2$, and a third different surface comprised native silicon oxide (grown under ambient conditions on a polished single crystal silicon surface). The SiN film was selectively deposited by an ALD process using silicon tetraiodide ($SiI_4$) as a first precursor and $NH_3$ as a second precursor. $SiI_4$ was contained in a ProE-Vap ampoule and heated to 100° C. $N_2$ carrier gas flowed over the surface of the solid $SiI_4$ carrying the $SiI_4$ vapor into the heated chamber with the substrate. Each deposition cycle was carried out with the substrate at a temperature of 200° C. and a reaction chamber pressure of 1.5 Torr. Each deposition cycle included a $SiI_4$ vapor pulse of 10 seconds, an inert $N_2$ purge for 10 seconds, an $NH_3$ pulse of 10 seconds and an inert $N_2$ purge for 10 seconds. Referring to FIG. 1, for an ALD process consisting of 100 deposition cycles the selectivity ratio of SiN deposited on $Al_2O_3$ and $ZrO_2$ (both deposited by ALD) relative to the native silicon oxide 90% at 18 Å deposited on the high k films.

Example 2

In this example, SiN was selectively deposited on the first surface of a substrate relative to a second and a third, different surface of the substrate. The first surface of the substrate comprised native silicon oxide. The second surface of substrate comprised $Al_2O_3$ deposited by ALD. The third surface comprised $ZrO_2$ deposited by ALD. Prior to SiN deposition, the substrate was subjected to a $NH_3$ plasma treatment process.

Figure 2:
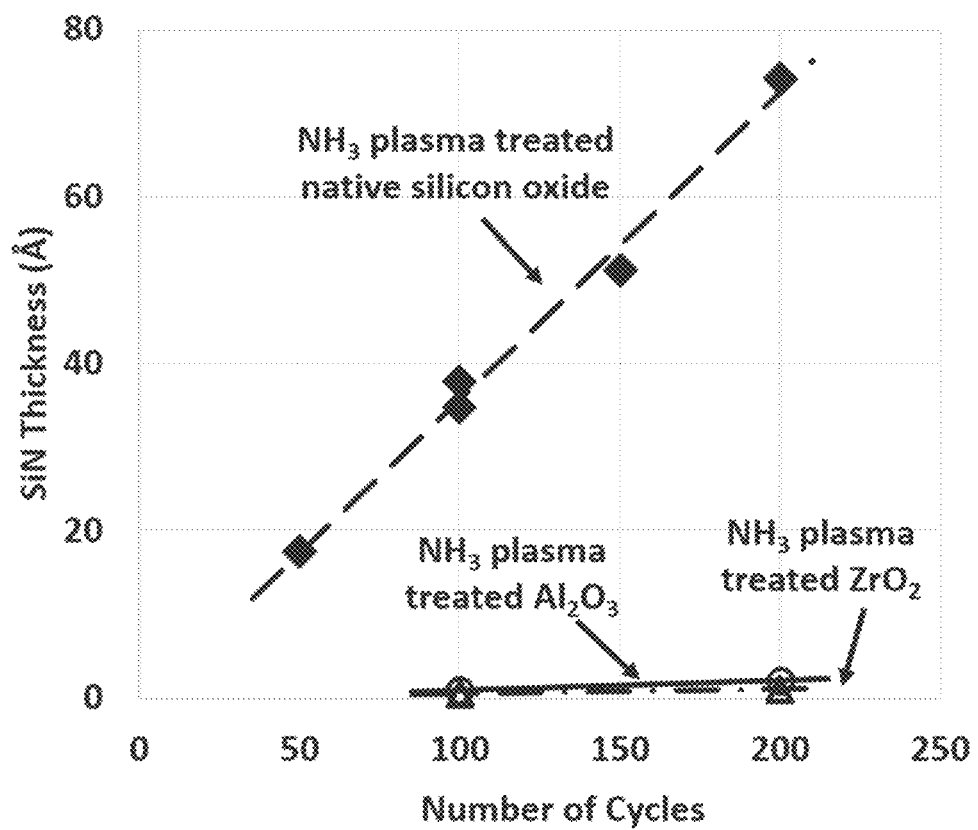
FIG. 2 is an illustration of the silicon nitride ($SiI_4/NH_3$) deposition at 200° C. on various oxide surfaces as depicted, wherein each oxide surface has been pre-treated with ammonium plasma. Thickness in angstroms is plotted versus number of cycles.

The SiN film was selectively deposited by an ALD process using silicon tetraiodide ($SiI_4$) as a first precursor and $NH_3$ as a second precursor using the same process as described in Example 1. Samples were deposited using an ALD process consisting of from 100 to 200 deposition cycles. As illustrated in FIG. 2, the thicknesses of material deposited on the first plasma treated native silicon oxide surface was measured and compared with the thicknesses of material deposited on the second and third surfaces, plasma treated $Al_2O_3$ and $ZrO_2$. FIG. 2 shows that SiN deposition on a first surface comprising plasma treated native silicon oxide had very high selectivity relative to both plasma treated $Al_2O_3$ and $ZrO_2$ surfaces. (Selectivity is over 95%).

The invention claimed is:

1. A process for selectively depositing silicon nitride on a microelectronic device substrate having a plurality of surfaces of differing composition, which comprises contacting said substrate with sequentially pulsed silicon tetraiodide or disilicon hexaiodide, and nitrogen-containing co-reactants, at a temperature of about 150° C. to about 400° C., and at a pressure below about 15 Torr, under atomic layer deposition conditions, wherein the Si source is heated above the melting point and vaporized with a carrier gas.

2. The process of claim 1, wherein the temperature is about 175° C. to about 350° C.

3. The process of claim 1, wherein the temperature is about 200° C. to about 250° C.

4. The process of claim 1, further comprising the step of pre-treating said substrate with ammonia plasma, and wherein the surface to be deposited thereon is chosen from silicon dioxide, germanium dioxide, SiCO, and low-k substrates.

5. The process of claim 4, wherein said device substrate comprises some surfaces chosen from silicon nitride, silicon dioxide, germanium dioxide, SiCO, and low-k substrates which have enhanced deposition of silicon nitride compared to other surfaces on the same substrate chosen from titanium nitride, tantalum nitride, aluminum nitride, hafnium oxide, zirconium oxide, and aluminum oxide, and combinations thereof.

6. The process of claim 4, wherein said device substrate is comprised of at least one silicon dioxide surface and at least one aluminum oxide surface, whereby said silicon nitride is selectively deposited on said at least one silicon dioxide surface.

7. The process of claim 4, wherein said device substrate is comprised of at least one silicon dioxide surface and at least one zirconium dioxide surface, whereby said silicon nitride is selectively deposited on said at least one silicon dioxide surface.

8. The process of claim 4, wherein said device substrate is comprised of at least one silicon dioxide surface and at least one hafnium dioxide surface, whereby said silicon nitride is selectively deposited on said at least one silicon dioxide surface.

9. The process of claim 1, wherein the temperature is from about 200° C. to about 250° C., and the substrate to be deposited thereon is other than silicon dioxide.

10. The process of claim 1, wherein said device substrate comprises some surfaces chosen from silicon nitride, titanium nitride, tantalum nitride, and aluminum nitride, hafnium oxide, zirconium oxide, aluminum oxide and combinations thereof, which have enhanced deposition of silicon nitride compared to other surfaces on the same substrate chosen from silicon dioxide, germanium dioxide, SiCO, and low-k substrates which have suppressed deposition of Silicon nitride.

11. The process of claim 1, wherein said device substrate is comprised of at least one silicon dioxide surface and at least one aluminum oxide surface, whereby said silicon nitride is selectively deposited on said at least one aluminum oxide surface.

12. The process of claim 1, wherein said device substrate is comprised of at least one silicon dioxide surface and at least one zirconium dioxide surface, whereby said silicon nitride is selectively deposited on said at least one zirconium dioxide surface.

13. The process of claim 1, wherein the nitrogen-containing precursor compound is chosen from ammonia, dimethyl hydrazine, t-butyl hydrazine, methylhydrazine, or a mixture thereof.

14. The process of claim 1, wherein the Si source is heated for vaporization in a ProE-Vap ampoule.

15. A process for selectively depositing silicon nitride on a microelectronic device substrate having a plurality of surfaces of differing composition, which comprises contacting said substrate with sequentially pulsed silicon tetraiodide or disilicon hexaiodide, and nitrogen-containing co-reactants, at a temperature of about 150° C. to about 400° C., and at a pressure below about 15 Torr, under atomic layer deposition conditions and further comprising the step of pre-treating said substrate with ammonia plasma, and wherein the surface to be deposited thereon is chosen from silicon dioxide, germanium dioxide, SiCO, and low-k substrates.

16. The process of claim 15, wherein said device substrate is comprised of at least one silicon dioxide surface and at least one aluminum oxide surface, whereby said silicon nitride is selectively deposited on said at least one silicon dioxide surface.

17. The process of claim 15, wherein said device substrate is comprised of at least one silicon dioxide surface and at least one zirconium dioxide surface, whereby said silicon nitride is selectively deposited on said at least one silicon dioxide surface.

18. The process of claim 15, wherein said device substrate is comprised of at least one silicon dioxide surface and at least one hafnium dioxide surface, whereby said silicon nitride is selectively deposited on said at least one silicon dioxide surface.

19. A process for selectively depositing silicon nitride on a microelectronic device substrate having a plurality of surfaces of differing composition, which comprises contacting said substrate with sequentially pulsed silicon tetraiodide or disilicon hexaiodide, and nitrogen-containing co-reactants, at a temperature of about 150° C. to about 400° C., and at a pressure below about 15 Torr, under atomic layer deposition conditions, wherein said device substrate comprises some surfaces chosen from silicon nitride, titanium nitride, tantalum nitride, and aluminum nitride, hafnium oxide, zirconium oxide, aluminum oxide and combinations thereof, which have enhanced deposition of silicon nitride compared to other surfaces on the same substrate chosen from silicon dioxide, germanium dioxide, SiCO, and low-k substrates which have suppressed deposition of silicon nitride.

* * * * *